United States Patent
Rigney et al.

[11] Patent Number: 6,153,313
[45] Date of Patent: Nov. 28, 2000

[54] NICKEL ALUMINIDE COATING AND COATING SYSTEMS FORMED THEREWITH

[75] Inventors: Joseph D. Rigney, Milford; Ramgopal Darolia, West Chester; William S. Walston, Maineville, all of Ohio; Reed R. Corderman, Niskayuna, N.Y.

[73] Assignee: General Electric Company, Cincinnati, Ohio

[21] Appl. No.: 09/166,883

[22] Filed: Oct. 6, 1998

[51] Int. Cl.$^7$ ............................. B32B 15/04; L22L 19/05
[52] U.S. Cl. ........................ 428/632; 428/652; 428/680; 416/241 R; 416/241 B
[58] Field of Search .................................. 428/615, 650, 428/652, 653, 678, 679, 680, 621, 632, 633; 420/447, 443, 551; 416/241 R, 241 B

[56] References Cited

U.S. PATENT DOCUMENTS

| | | | |
|---|---|---|---|
| Re. 33,876 | 4/1992 | Goward et al. | 428/633 |
| 4,530,885 | 7/1985 | Restall | 428/670 |
| 4,610,736 | 9/1986 | Barrett et al. | 148/429 |
| 4,612,165 | 9/1986 | Liu et al. | 420/459 |
| 4,731,221 | 3/1988 | Liu | 420/445 |
| 4,916,022 | 4/1990 | Solfest et al. | 428/623 |
| 5,108,700 | 4/1992 | Liu | 420/445 |
| 5,116,438 | 5/1992 | Darolia et al. | 148/404 |
| 5,116,691 | 5/1992 | Darolia et al. | 428/614 |
| 5,215,831 | 6/1993 | Darolia et al. | 428/614 |
| 5,238,752 | 8/1993 | Duderstadt et al. | 428/623 |
| 5,302,465 | 4/1994 | Miller et al. | 428/552 |
| 5,427,866 | 6/1995 | Nagaraj et al. | 428/610 |
| 5,516,380 | 5/1996 | Darolia et al. | 148/404 |
| 5,824,423 | 10/1998 | Maxwell et al. | 428/623 |

FOREIGN PATENT DOCUMENTS

WO 97/29219  8/1997  WIPO ............................. C23C 28/00

OTHER PUBLICATIONS

Pint et al., Evaluation of TBC–Coated β–NiAl Substrates Without a Bond Coat, Elevated Temperature Coatings: Science and Tech.II, The Minerals, Metals and Materials Society (1996), p. 163–173 (No Month).

Pint et al., Substrate and Bond Coat Compositions: Factors Affecting Alumina Scale Adhesion, NIST TBC Workshop 1997, Cincinnati OH (May 19–21, 1997), p. 109–125.

*Primary Examiner*—Deborah Jones
*Assistant Examiner*—Jason Resnick
*Attorney, Agent, or Firm*—Andrew C. Hess; David L. Narciso

[57] ABSTRACT

A coating system (20) for articles used in hostile thermal environments, such as turbine, combustor and augmentor components (10) of a gas turbine engine. The coating system (20) of this invention employs a NiAl-based intermetallic coating (24) containing 30 to 60 atomic percent aluminum so as to be predominantly of the β-NiAl phase, but also contains alloying additions intended to increase the creep strength of the coating (24), and optionally contains alloying additions to getter impurities, increase fracture resistance, and promote oxidation resistance. For this purpose, the coating (24) preferably includes additions of chromium, titanium, tantalum, silicon, hafnium and/or gallium, and optionally contains additions of calcium, zirconium, yttrium, and/or iron.

27 Claims, 3 Drawing Sheets

NICKEL ALUMINIDE COATING AND COATING SYSTEMS FORMED THEREWITH

FIELD OF THE INVENTION

This invention relates to coatings of the type used to protect components exposed to high temperature environments, such as the hostile thermal environment of a gas turbine engine. More particularly, this invention is directed to a predominantly beta (β) phase NiAl coating deposited by physical vapor deposition, wherein the coating is alloyed to exhibit enhanced strength and composition stability, and as a result is useful as a bond coat for a thermal insulating ceramic layer.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through formulation of iron, nickel and cobalt-base superalloys, though such alloys alone are often inadequate to form components located in certain sections of a gas turbine engine, such as the turbine, combustor and augmentor. A common solution is to protect such components with an oxidation-resistant coating or a thermal barrier coating (TBC). Diffusion coatings, such as diffusion aluminides and platinum aluminides, and overlay coatings such as MCrAlY (where M is iron, cobalt and/or nickel) have been widely employed as environmental coatings and as bond coats for thermal barrier coatings on gas turbine engine components.

To be effective, thermal barrier coatings must have low thermal conductivity, strongly adhere to the article, and remain adherent throughout many heating and cooling cycles. The latter requirement is particularly demanding due to the different coefficients of thermal expansion between materials having low thermal conductivity and superalloy materials typically used to form turbine engine components. Thermal barrier coating systems (TBC systems) capable of satisfying the above requirements have generally required a bond coat, such as the above-noted diffusion and MCrAlY coatings. Ceramic layers formed of metal oxides such as zirconia ($ZrO_2$) that is partially or fully stabilized by yttria ($Y_2O_3$), magnesia (MgO) or other oxides, have been widely employed as materials for thermal barrier coatings. The ceramic layer is typically deposited by air plasma spraying (APS), low pressure plasma spraying (LPPS), or a physical vapor deposition (PVD) technique, such as electron beam physical vapor deposition (EBPVD) which yields a strain-tolerant columnar grain structure.

The aluminum content of the above-noted bond coat materials provides for the slow growth of a strong adherent continuous aluminum oxide layer (alumina scale) at elevated temperatures. This thermally grown oxide (TGO) protects the bond coat from oxidation and hot corrosion, and chemically bonds the ceramic layer to the bond coat. However, a thermal expansion mismatch exists between the metallic bond coat, alumina scale and ceramic layer, and tensile stresses generated by this mismatch gradually increase over time to the point where spallation can occur at the interface between the bond coat and alumina scale or the interface between the alumina scale and ceramic layer. Furthermore, though bond coat materials are particularly alloyed to be oxidation-resistant, the surface oxidation and interdiffusion (with the substrate) that occurs over time at elevated temperatures gradually depletes aluminum from the bond coat. Eventually, the level of aluminum within the bond coat can become sufficiently depleted to prevent further slow growth of the protective alumina scale and to allow for the more rapid growth of nonprotective oxides, the result of which again is spallation of the ceramic layer. In addition to depletion of aluminum, the ability of the bond coat to form the desired alumina scale can be hampered by the interdiffusion of certain elements between the superalloy and bond coat, such as during formation of a diffusion aluminide coating and during high temperature exposure.

From the above, it is apparent that the service life of a TBC system is dependent on the bond coat used to anchor the thermal insulating ceramic layer. Consequently, considerable research is directed to improved bond coats for TBC systems, including efforts directed toward the use of oxidation-resistant materials other than diffusion coatings and MCrAlY alloy coatings. One example is bond coats formed of an overlay (i.e., not a diffusion) of beta (β) phase nickel aluminide (NiAl) intermetallic, whose composition is about 50 atomic percent (about 30 weight percent) aluminum, the balance being nickel. In the past, gas turbine engine components formed of NiAl intermetallic have been proposed. For example, advanced NiAl intermetallic alloys are reported in commonly-assigned U.S. Pat. Nos. 5,116,438, 5,116,691, 5,215,831 and 5,516,380 as suitable for forming gas turbine engine components. These patents are primarily concerned with including alloying additions to the NiAl intermetallic for the purpose of improving high temperature mechanical strength and low temperature ductility, neither of which has been previously of particular concern for TBC bond coats, since bond coats are deposited as sacrificial layers on the outer surfaces of components and do not contribute to the strength of the components.

NiAl intermetallic has also been proposed as an environmental coating in U.S. Pat. No. 4,610,736 to Barrett et al., in which additions of about 0.05 to 0.25 weight percent zirconium were shown to improve the cyclic oxidation resistance of the intermetallic, though whether such a coating could be used as a bond coat for a TBC system was not reported or evident. More recently, in commonly-assigned U.S. patent application Ser. No. 08/932,304 to Darolia, β-phase nickel aluminide bond coat containing a limited amount of zirconium and/or other reactive elements such as hafnium, yttrium and cesium, is reported to promote the adhesion of a ceramic TBC layer to the extent that the service life of the resulting TBC system is drastically increased.

As with Barrett et al., Darolia teaches that additions of zirconium and other reactive elements serve to promote the oxidation resistance of β-phase NiAl intermetallic. Darolia also teaches that minimizing the diffusion zone between a NiAl bond coat and its underlying substrate promotes the formation of an initial layer of essentially pure aluminum oxide, promotes the slow growth of the protective aluminum oxide layer during service, and reduces the formation of voluminous nonadherent oxides of substrate constituents that tend to diffuse into the bond coat, such as nickel, cobalt, chromium, titanium, tantalum, tungsten and molybdenum. As such, Darolia teaches that NiAl bond coats can perform extremely well as a bond coat for a TBC if properly alloyed and deposited to contain only NiAl intermetallic and zirconium or another reactive element. Notably, Darolia subscribes to the conventional wisdom that alloying additions of chromium, titanium and tantalum to a bond coat detrimentally encourage the growth of alumina scale, leading to reduced spallation life of a ceramic layer on the bond coat.

Consequently, it is apparent that the alloying requirements of a NiAl coating differ from that of NiAl articles, such as those of previously-mentioned U.S. Pat. No. 5,516,380.

Even with the advancements of Darolia, there remains a considerable and continuous effort to further increase the service life of TBC systems by improving the spallation resistance of the thermal insulating layer.

SUMMARY OF THE INVENTION

The present invention generally provides a protective overlay coating for articles used in hostile thermal environments, such as turbine, combustor and augmentor components of a gas turbine engine. The method is particularly directed to increasing the spallation resistance of a thermal barrier coating (TBC) system with a predominantly β-phase NiAl overlay bond coat. According to the invention, an unexpected improvement in spallation resistance is achieved with β-phase NiAl bond coats alloyed to exhibit increased creep resistance, fracture toughness and fracture energy as compared to prior art β-phase NiAl environmental coatings and TBC bond coats. What is unexpected is that increased spallation resistance is achieved with alloying additions known to reduce the oxidation resistance of a NiAl bond coat.

As part of a TBC system, the NiAl bond coat of this invention adheres a thermal-insulating ceramic layer to a substrate, typically a superalloy article. As with prior art aluminum-containing bond coats, the bond coat of this invention develops a continuous aluminum oxide surface layer (alumina scale) that promotes the adhesion of the ceramic layer to the bond coat. The alumina scale is grown on the bond coat by heat treatment prior to or during deposition of the ceramic layer.

As a β-phase NiAl intermetallic overlay coating, the bond coat of this invention contains 30 to 60 atomic percent aluminum so as to be predominantly of the β-NiAl phase. As noted above, a key feature of this invention is that the bond coat also preferably contains alloying additions of elements that increase the creep strength of the bond coat, the result of which has been an unexpected improvement in spallation resistance of a TBC deposited on the bond coat. Of particular note is the inclusion of chromium, titanium, and/or tantalum—the improved spallation resistance resulting from these alloying additions is contrary to conventional wisdom that alloying additions of these elements detrimentally encourage the growth of alumina scale and reduce spallation life, as reflected in the aforementioned U.S. patent application Ser. No. 08/932,304 to Darolia. However, according to this invention, the increased creep resistance, fracture toughness and fracture energy of a NiAl bond coat achieved by sufficient alloying additions of chromium, titanium and/or tantalum unexpectedly more than compensates for the reduction in oxidation resistance of the bond coat that occurs as a result of the presence of these elements, so that the net effect is an increase in the life of a TBC on the bond coat. Chromium additions have been unexpectedly shown by this invention to reduce the growth rate of the bond coat and of the interdiffusion layer between the bond coat and its substrate, and therefore is a preferred alloying constituent of this invention.

The bond coat optionally contains alloying additions to getter impurities that might diffuse into the bond coat from its underlying substrate, and preferably also contains one or more elements to promote the oxidation resistance of the bond coat. In particular, the NiAl bond coat of this invention may contain silicon to promote the oxidation resistance of the bond coat, and/or calcium to getter impurities in the bond coat. The NiAl intermetallic may also contain hafnium and/or zirconium to promote the oxidation resistance and creep resistance of the bond coat, and/or hafnium, zirconium and/or yttrium to promote oxide pegging, and/or calcium, hafnium, zirconium and/or yttrium to getter impurities in the bond coat. The NiAl intermetallic may also contain gallium and/or iron to promote the fracture resistance of the bond coat.

In addition to promoting the spallation resistance of a TBC, certain coating compositions of this invention are also believed to be sufficiently oxidation resistant to survive numerous cycles after spallation of the TBC has occurred. Accordingly, in addition to being suitable as bond coats for TBC systems, these protective β-phase NiAl compositions also have application as environmental coatings.

Other objects and advantages of this invention will be better appreciated from the following detailed description.

DETAILED DESCRIPTION OF THE INVENTION

Figure 1:
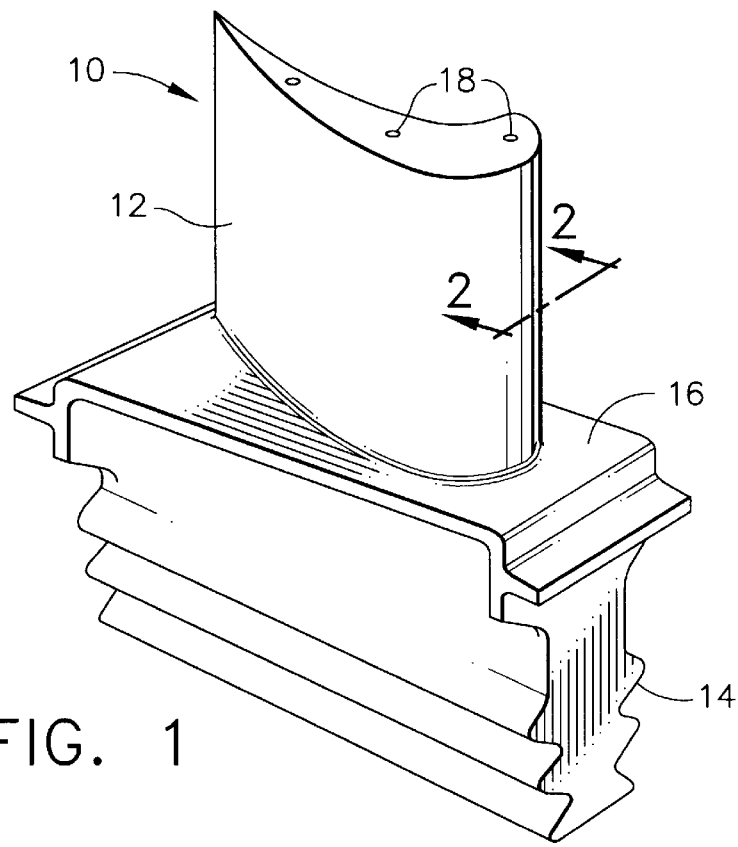
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, and particularly nickel-base superalloy blades of the type shown in FIG. 1, the teachings of this invention are generally applicable to any component on which a coating system may be used to protect the component from its environment.

Figure 2:
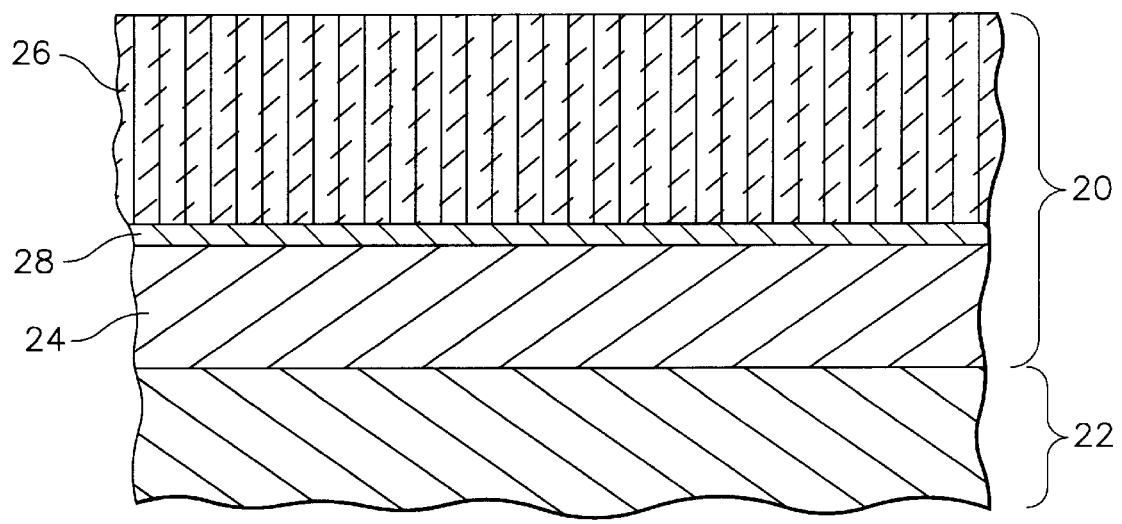
FIG. 2 is a cross-sectional view of the blade of FIG. 1 along line 2—2, and shows a thermal barrier coating system on the blade in accordance with an embodiment of this invention.

Represented in FIG. 2 is a TBC system 20 of a type that benefits from the teachings of this invention. As shown, the coating system 20 includes a ceramic layer 26 bonded to the blade substrate 22 with an overlay bond coat 24. The substrate 22 (blade 10) is preferably a high-temperature material, such as an iron, nickel or cobalt-base superalloy. To attain a strain-tolerant columnar grain structure, the ceramic layer 26 is preferably deposited by physical vapor deposition (PVD), though other deposition techniques could be used. A preferred material for the ceramic layer 26 is an yttria-stabilized zirconia (YSZ), with a suitable composition being about 4 to about 20 weight percent yttria, though other ceramic materials could be used, such as yttria, nonstabilized zirconia, or zirconia stabilized by ceria ($CeO_2$), scandia ($Sc_2O_3$) or other oxides. The ceramic layer 26 is deposited to a thickness that is sufficient to provide the required thermal protection for the underlying substrate 22 and blade 10, generally on the order of about 125 to about 300 micrometers. As with prior art TBC systems, the surface of the bond coat 24 oxidizes to form an aluminum oxide surface layer (alumina scale) 28 to which the ceramic layer 26 chemically bonds.

According to the invention, the over lay bond coat 24 is a nickel aluminide intermetallic of predominantly the beta ($\beta$) NiAl phase with limited alloying additions. The NiAl bond coat 24 is formed using a PVD process, preferably magnetron sputter physical vapor deposition or electron beam physical vapor deposition (EBPVD), though it is foreseeable that other deposition techniques could be used. According to the invention, an adequate thickness for the NiAl bond coat 24 is about 15 micrometers in order to protect the underlying substrate 22 and provide an adequate supply of aluminum for oxide formation, though thicknesses of about 10 to about 125 micrometers are believed to be suitable.

The preferred PVD techniques are preferably carried out to reduce the diffusion of the bond coat 24 into the substrate 22. Preferably, deposition of the bond coat 24 results in virtually no diffusion between the bond coat 24 and substrate 22. During subsequent heat treatment to relieve residual stresses generated during the deposition process, a very thin diffusion zone of not more than about five micrometers, typically about 2.5 to 5 micrometers, may develop. A preferred heat treatment is conducted at about 1800° F. (about 980° C.) for about two to four hours in an inert atmosphere, such as argon. Importantly, the minimal thickness of the diffusion zone promotes the initial formation of the alumina scale 28 as essentially pure aluminum oxide, promotes the slow growth of the protective alumina scale 28 during service, reduces the formation of voluminous nonadherent oxides at the bond coat-ceramic layer interface, and reduces the amount of substrate material that must be removed during refurbishment of the TBC system 20. Accordingly, articles such as the blade 10 shown in FIG. 1 can be refurbished more times than would be possible if a diffusion bond coat were used.

According to this invention, improving the creep strength of a predominantly $\beta$-phase NiAl bond coat has a significant effect on the spallation resistance of a ceramic layer adhered to the bond coat to form a TBC system. Further improvements in spallation resistance can be achieved with this invention with further alloying additions to improve the oxidation resistance of the bond coat, "peg" the alumina scale that forms on the bond coat, getter impurities in the bond coat, and increase the fracture resistance of the bond coat. The NiAl bond coat 24 contains nickel and aluminum, preferably with an aluminum content of about 30 to 60 atomic percent to attain the $\beta$-phase NiAl intermetallic. In addition, the bond coat 24 contains chromium, titanium, tantalum, silicon and/or calcium, the presence of which has been shown to promote the spallation resistance of the ceramic layer 26. More particularly, the bond coat 24 preferably contains chromium, titanium and/or tantalum to promote the creep strength of the bond coat. For NiAl compositions of this invention, additions of additions of yttrium, hafnium and/or zirconium have been shown to generate an irregular surface on the bond coat that "pegs" the desired alumina scale, and additions of calcium, yttrium, hafnium and/or zirconium have been shown to getter impurities in the bond coat. The NiAl intermetallic may also contain hafnium and/or zirconium to further promote the creep and oxidation resistance of the bond coat.

According to the invention, additions of chromium, titanium, tantalum, hafnium and zirconium provide increased creep resistance in the presence of the high thermal stresses generated in TBC bond coats. This improvement has been shown to be the result of solid solution and precipitation strengthening from fine $\alpha$-Cr phases or $\beta'$ Heusler phases dispersed within the $\beta$ phase of the bond coat, and is believed to sufficiently increase the strength of the bond coat to limit the creep deformation and rumpling of the bond coat surface, which this invention has determined to contribute to early failures of conventional bond coat materials. Limited additions of gallium and/or iron can also be made to the NiAl intermetallic to promote the fracture resistance of the bond coat.

Chromium is believed to be a particularly useful alloy addition to NiAl bond coats of this invention. As well as increasing strength, chromium additions are believed to help maintain the stability of the $\beta$-phase, improve corrosion resistance of the bond coat, and lower the coating growth rate caused by interdiffusion with the substrate. Sufficient additions of chromium to $\beta$-phase NiAl have been shown by this invention to enhance the high temperature retention of the $\beta$-phase and maintain its composition (higher aluminum contents) in spite of the driving forces for the diffusional loss of aluminum to the substrate during high temperature operation. The additions of the other creep-strengthening elements are also believed to lower self-diffusion rates within the coating to provide increased coating composition and $\beta$-phase stability. In the event of spallation, the added chromium also helps to guard against corrosion attack.

Notably, the diffusion of chromium, titanium and tantalum from superalloy substrates into prior art bond coats has been viewed as detrimental to spallation resistance on the basis of encouraging the growth rate of aluminum oxide and nonadherent oxides at the bond coat-ceramic layer interface. U.S. patent application Ser. No. 08/932,304 to Darolia specifically cites these elements for this reason. Nonetheless, the present invention intentionally alloys a $\beta$-phase NiAl bond coat with these elements to unexpectedly improve spallation resistance of a TBC system.

Yttrium, hafnium and zirconium in the NiAl coating composition of this invention preferentially oxidize at the coating surface, forming "pegs" that increase the mechanical integrity of the alumina scale that forms on the coating. These pegs create an irregular or roughened surface that increases the extrinsic resistance to crack propagation at the bond coat-TBC interface by providing a tortuous crack path. Finally, additions of calcium, hafnium, zirconium and yttrium serve to scavenge impurity atoms such as sulfur, potassium and carbon that decrease interface cohesion.

Broad and narrower ranges for individual constituents of the bond coat 24 are stated in atomic percents in Table I below.

TABLE I

|  | Broad | Narrower | Preferred |
|---|---|---|---|
| Aluminum | 30–60% | 35–55% | 35–50% |
| Chromium | To 25% | 0.5–25% | 0.5–15% |
| Titanium | To 5% | 0.1–5.0% | 0.1–5.0% |
| Tantalum | To 5% | 0.1–5.0% | 0.1–3.0% |
| Silicon | To 5% | 0.1–5.0% | 0.1–2.0% |
| Calcium | To 1% | 0.01–1.0% | 0.01–1.0% |
| Hafnium | To 2% | 0.01–2.0% | 0.01–2.0% |
| Iron | To 1% | 0.02–0.5% | 0.02–0.5% |
| Yttrium | To 1% | 0.01–1.0% | 0.01–1.0% |
| Gallium | To 0.5% | 0.02–0.2% | 0.02–0.2% |
| Zirconium | To 0.5% | 0.01–0.5% | 0.01–0.5% |
| Nickel | Balance | Balance | Balance |

During an investigation leading to this invention, 7% yttria-stabilized zirconia (YSZ) was deposited by EBPVD to a thickness of about 125 micrometers on single-crystal NiAl-based specimens whose compositions are indicated in Tables II and III. All specimens contained about 50 atomic percent nickel. As indicated in Table II, specimen D5 was essentially stoichiometric NiAl with no intentional alloying additions, specimens D91A and D138 contained zirconium in accordance with U.S. patent application Ser. No. 08/932,304 to Darolia, while the remaining specimens were alloyed to contain two or more of chromium, titanium, gallium and hafnium. Surface preparation of the specimens prior to deposition of the YSZ TBC included chemical milling (Specimens D5, D91A and D138) and chemical milling plus vapor honing (remaining specimens) according to standard practices for these processes. The tests entailed furnace cycle testing (FCT) at 2075° F. (about 1135° C.), 2125° F. (about 1163° C.) and 2150° F. (about 1175° C.), each of which entailed 45 minutes at peak temperature in a one-hour thermal cycle. The life of individual specimens is identified in Tables II and III by the number of cycles completed prior to spallation of 20% of the surface area, as well as the percent of surface area spalled at the time of "failure." "+" indicates a test in progress before sufficient spallation occurred to constitute a failure. The data in Table III are for specimens tested at 2125° F., but whose results are estimated for 2150° F. based on known knock-down factors.

TABLE II

| SPECIMEN (atomic %) | 2075° F. FCT LIFE | 2075° F. FCT % SPALLED | 2150° F. FCT LIFE | 2150° F. FCT % SPALLED |
|---|---|---|---|---|
| D5: (50Al) | 80 | 96 | 40 | 40 |
|  | 120 | 70 | 40 | 100 |
|  | 140 | 62 | 60 | 96 |
| D91A: (49.5Al—0.5Zr) | 2820 | 24 | 700 | 24 |
|  | 4000 | 26 | 760 | 20 |
|  | 4200 | 20 | 760+ | 13+ |
| D138: (49.9Al—0.1Zr) | 5920+ | 0+ | 1620 | 28 |
|  | 5920+ | 0+ | 1700 | 50 |
|  | 5920+ | 0+ | 1740 | 26 |
| D176: (49.45Al—0.5Hf—0.05Ga) | — | — | 1540+ | 0+ |
|  | — | — | 1940 | 25 |
|  | — | — | 1940 | 22 |
|  | — | — | 2060 | 33 |
| D218: (48.3Al—1.0Ti—0.5Hf—0.2Ga) | — | — | 1540+ | 0+ |
|  | — | — | 2360+ | 3+ |
|  | — | — | 2360+ | 1+ |
|  | — | — | 2360+ | 1+ |

TABLE III

| SPECIMEN (atomic %) | ESTIMATED LIFE | 2150° F. FCT % SPALLED |
|---|---|---|
| D200: | 1940+ | 0+ |
| (49.5Al—0.5Hf) | 1704+ | 0+ |
| AFD2: | 1976+ | 0+ |
| (48.5Al—1.0Cr—0.5Hf) | 1976+ | 0+ |
| AFS8 |  |  |
| (47.15Al—2.0Cr— | 1500+ | 0+ |
| 0.25Fe—0.5Hf—0.1Y | 1059+ | 0+ |
| AFN16 |  |  |
| (48.05Al—0.75Ti— | 1976+ | 0+ |
| 0.5Cr—0.5Hf—0.2Ga) | 1976+ | 0+ |
| D219 |  |  |
| (44.3Al—5.0Ti— | 1976+ | 0+ |
| 0.5Hf—0.2Ga) | 1976+ | 0+ |

The above results evidence that specimens alloyed with chromium and titanium performed exceptionally well compared to those of the prior art, e.g., stoichiometric NiAl containing about 50 atomic percent aluminum and no other additional alloying elements. In general, the data was concluded to suggest that increasing the creep strength and modifying the bond coat surface with additions of chromium, titanium, zirconium and/or hafnium increase the thermal cycle spallation resistance. The best results have thus far been achieved with the D218 specimen with the addition of about 1 atomic percent titanium. This is believed to be attributable to a significant increase in strength achieved with the addition of titanium, thereby making the NiAl intermetallic less prone to creep deformation under high thermal stresses developed during high temperature excursions. In addition, the percentage spalled indicates that the rate at which spallation occurs for the D218 specimens tested at 2150° F. is lower than the other specimens, evidencing a more tenacious bond between the alumina scale and NiAl substrate. Notably, such a result is obtained though titanium is known to reduce oxidation resistance in aluminum-containing compositions. Accordingly, the improved spallation resistance of D218 was unexpected, and was attributed to the ability of titanium to increase creep resistance.

Figure 3:
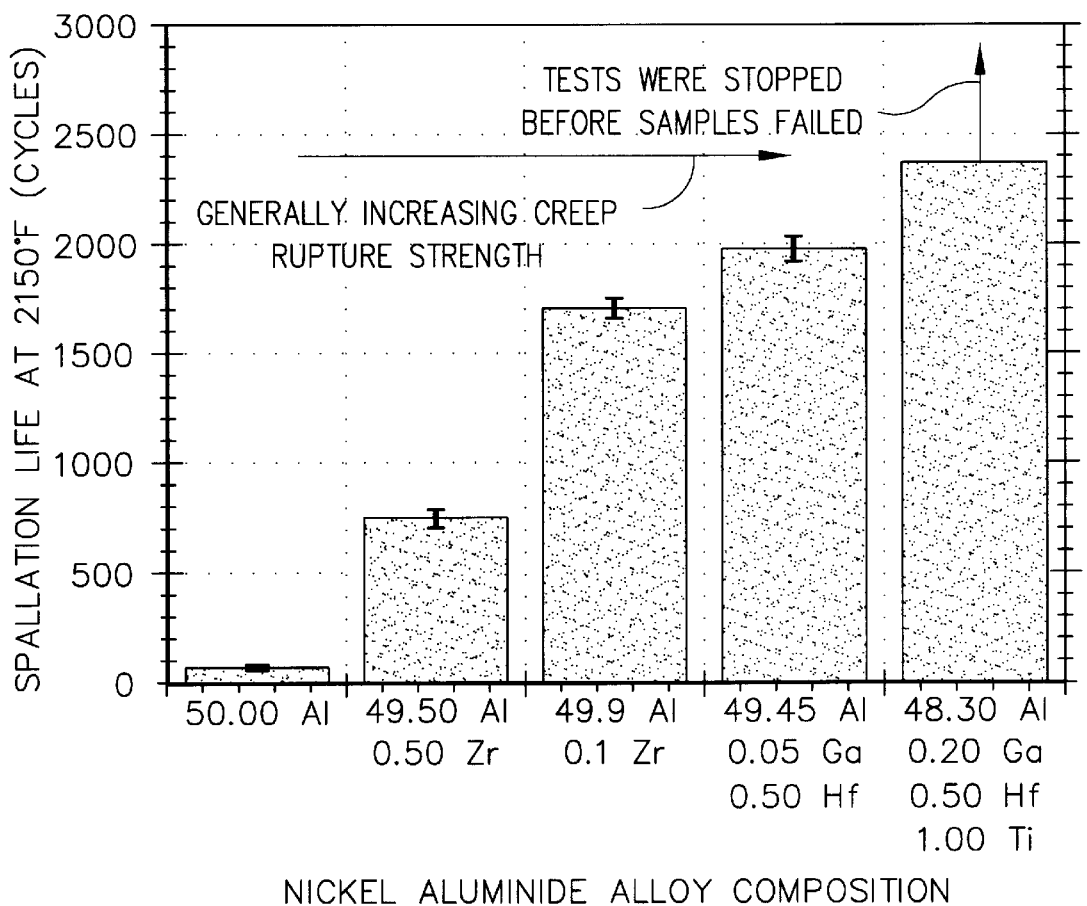
FIG. 3 is a graph illustrating the relative furnace cycle test spallation performance of various NiAl intermetallic bond coats, including those whose compositions are in accordance with the present invention.

FIG. 3 graphically illustrates the relative furnace cycle test spallation performance benefits achieved by alloying NiAl intermetallics for creep resistance in accordance with this invention. The results are for specimens D5, D91A, D138, D176 and D218 of Table II. The error bars represent a spread of two standard deviations in the data plotted. Creep strength of the materials generally increases from left to right. FIG. 3 shows a life difference for specimen D218 of nearly 50 times over stoichiometric NiAl resulting from the creep strength increase and interface modification which are attributed to the additions of titanium, gallium and hafnium. Testing of D218 was stopped without spallation, such that the life indicated in Table I and FIG. 3 is seen as a lower limit for the D218 composition, and the full potential for this composition is yet to be fully realized.

During a subsequent investigation, nickel-base superalloy specimens were coated with TBC systems that included NiAl-based bond coats within the scope of this invention. The superalloy was René N5, having a nominal composition, in weight percent, of Ni-7.5Co-7.0Cr-6.5Ta-6.2Al-5.0W-3.0Re-1.5Mo-0.15Hf-0.05C-0.004B-0.01Y. For this test, a baseline was established with eleven specimens that were prepared with platinum aluminide (PtAl) bond coats in accordance with known diffusion techniques. The remaining NiAl bond coats were deposited by EBPVD or sputtering to a thickness of about 15 to 75 micrometers, over which 7% YSZ was deposited by EBPVD to a thickness of about 125 micrometers. All NiAl specimens contained about 48 to 60 atomic percent nickel, and were separated into groups of four to six specimens.

As indicated in Table IV, the bond coats for one group of superalloy specimens were NiAl without alloying additions, and another group of specimens had NiAl bond coats alloyed with zirconium in accordance with U.S. patent application Ser. No. 08/932,304 to Darolia. The remaining NiAl-coated groups of superalloy specimens were provided with bond coats alloyed with chromium, titanium, silicon, zirconium and/or hafnium. Each of the specimens was stress relieved by heat treating at 1800° F. (about 980° C.) for about two hours prior to deposition of the YSZ TBC. Spallation resistance of the YSZ TBCs was then evaluated by furnace cycle testing (FCT) using a peak temperature of about 2125° F. (about 1163° C.), with 45 minutes at peak temperature in a one-hour thermal cycle. The average life of each group of specimens is identified by the number of cycles completed prior to spallation of 20% of the surface area. The "% spalled" value is the average percent of surface area spalled at the time the 20% limit was exceeded for only those specimens that exceeded the limit. "+" indicates a test in progress before sufficient spallation occurred to discontinue test.

TABLE IV

| SPECIMEN (atomic %) | DEPOSITION PROCESS | 2125° F. FCT LIFE | % SPALLED |
|---|---|---|---|
| 39.1Al | EBPVD | 167 | 89 |
| 40.3Al—0.049Zr | EBPVD | 500 | 45 |
| 34.4Al—14.2Cr—0.12Zr | EBPVD | 625 | 22 |
| 42.9Al—1.75Cr—0.25Zr | EBPVD | 808+ | 27 |
| 41.4Al—0.70Si—0.213Zr | EBPVD | 748+ | 24 |
| 45.5Al—1.04Ti—0.14Hf | Sputter | 380 | 100 |
| PtAl (baseline) | Diffusion | 229 | 82 |

The above results indicated that bond coats formed of NiAl intermetallic alloyed with chromium and zirconium and with silicon and zirconium exhibited considerably more resistance to spallation than stoichiometric NiAl. The specimens also exhibited significantly better spallation resistance and, very importantly, a reduced rate of spallation as compared to NiAl alloyed with only zirconium. All alloyed NiAl specimens performed better than the baseline PtAl bond coat specimens, which can be attributed to the uncontrolled presence of constituents in the bond coat as a result of interdiffusion with the superalloy substrate. From these results, it was concluded that additions of chromium to NiAl intermetallic not only increase FCT life, but also increase the damage tolerance of the TBC system, i.e., the spall rate of the TBC.

Figure 4:
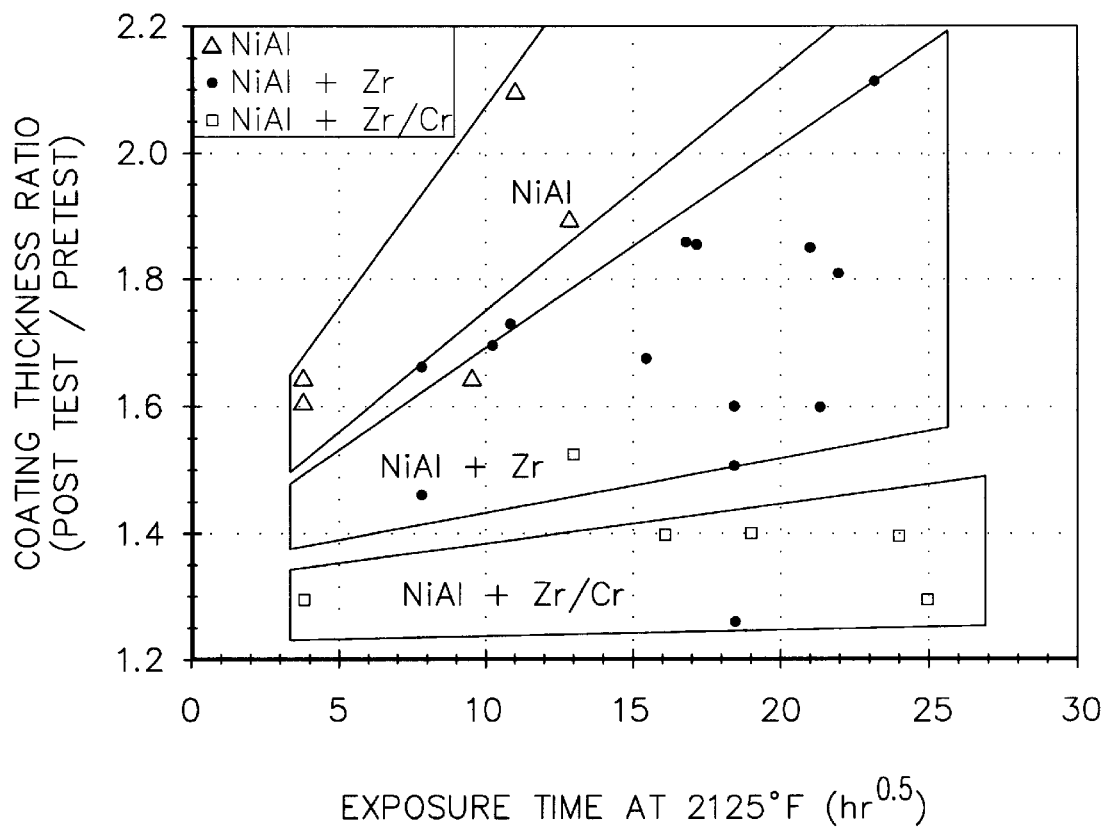
FIG. 4 is a graph illustrating the relative coating growth that occurs during high temperature exposures of NiAl intermetallic bond coats and bond coats whose compositions are in accordance with the present invention.

Another benefit attributable to the addition of chromium to NiAl bond coats is evidenced in FIG. 4, which shows bond coat growth and substrate consumption as being significantly reduced for NiAl+Cr+Zr bond coats as compared to NiAl+Zr bond coats, and even more significantly reduced when compared to NiAl bond coats containing no alloying additions. The graph of FIG. 4 represents the normalized coating growth of NiAl bond coats and various NiAl+Zr and NiAl+Zr+Cr bond coats that occurred during exposures at 2125° F. (about 1163° C.) due to substrate interdiffusion. The data were obtained with samples whose bond coats were deposited by EBPVD on superalloy substrates, coated with thermal barrier coatings, and then cycled to spallation at 2125° F. The results portrayed in FIG. 4 indicate that the thickness of the NiAl bond coats (those without additions of chromium or zirconium) increased much more rapidly as a result of interdiffusion than did NiAl+Zr and NiAl+Cr+Zr bond coats, with the latter group of bond coats exhibiting the slowest growth. These results indicate that NiAl+Cr+Zr bond coats are better able to retain the critical airfoil wall thickness during engine operation, and promote the repairability of airfoils as a result of less wall consumption. Notably, the NiAl+Cr+Zr specimens exhibited FCT lives of about twice that of the unalloyed NiAl specimens, evidencing the overall improvement in spallation resistance that can be expected when chromium and zirconium are both present in a NiAl bond coat.

While the invention has been described and tested for use as a bond coat of a thermal barrier coating system, the protective β-phase NiAl coating compositions of this invention are also sufficiently oxidation resistant to be suitable as environmental coatings. Accordingly, the scope of our invention is to be limited only by the following claims.

What is claimed is:

1. A coating system on a substrate, the coating system comprising a thermal-insulating ceramic layer adhered to the substrate by a predominantly β-phase NiAl intermetallic overlay coating layer, the intermetallic overlay coating layer consisting of 30 to 60 atomic percent aluminum, at least one element chosen from the group consisting of 0.5 to 25 atomic percent chromium, 0.1 to 5 atomic percent titanium, and 0.01 to 2.0 atomic percent hafnium, and optionally at least one element chosen from the group consisting of 0.1 to 5 atomic percent tantalum, 0.1 to 5 atomic percent silicon, 0.02 to 0.2 atomic percent gallium, 0.01 to 0.5 atomic percent zirconium, 0.01 to 1 atomic percent calcium, 0.02 to 0.5 atomic percent iron, and 0.01 to 1 atomic percent yttrium, the balance nickel and impurities.

2. A coating system as recited in claim 1, wherein the intermetallic overlay coating layer contains chromium in the amount of 0.5–15 atomic percent.

3. A coating system as recited in claim 1, wherein the intermetallic overlay coating layer contains at least one element chosen from the group consisting of 0.01 to 1 atomic percent calcium, 0.02 to 0.5 atomic percent iron, and 0.01 to 1 atomic percent yttrium.

4. A coating system as recited in claim 1, wherein the intermetallic overlay coating layer contains 0.01 to 0.5 atomic percent zirconium.

5. A coating system as recited in claim 1, wherein the intermetallic overlay coating layer consists of, in atomic percent, 30 to 50 aluminum, 0.5 to 15 chromium, and 0.01 to 2 hafnium, the balance nickel.

6. A coating system as recited in claim 1, wherein the intermetallic overlay coating layer consists of, in atomic percent, 30 to 50 aluminum, 0.5 to 15 chromium, and 0.01 to 0.5 zirconium, the balance nickel.

7. A coating system as recited in claim 1, wherein the intermetallic overlay coating layer consists of, in atomic percent, 30 to 50 aluminum, 0.5 to 15 chromium, 0.02 to 0.5 iron, 0.01 to 2 hafnium, and 0.01 to 1 yttrium, the balance nickel.

8. A coating system as recited in claim 1, wherein the intermetallic overlay coating layer consists of, in atomic percent, 30 to 50 aluminum, 0.5 to 15 chromium, 0.1 to 5 titanium, 0.01 to 2 hafnium, and 0.02 to 0.2 gallium, the balance nickel.

9. A coating system as recited in claim 1, wherein the intermetallic overlay coating layer consists of, in atomic percent, 30 to 50 aluminum, 0.02 to 0.2 gallium, and 0.01 to 2 hafnium, the balance nickel.

10. A coating system as recited in claim 1, wherein the intermetallic overlay coating layer consists of, in atomic percent, 30 to 50 aluminum, 0.1 to 5 titanium, 0.01 to 2 hafnium, and 0.02 to 0.2 gallium, the balance nickel.

11. A coating system as recited in claim 1, wherein the intermetallic overlay coating layer consists of, in atomic percent, 30 to 50 aluminum, 0.1 to 5 titanium, and 0.01 to 2 hafnium, the balance nickel.

12. A thermal barrier coating system on a substrate of a gas turbine engine component, the coating system comprising a ceramic layer on a predominantly β-phase NiAl intermetallic overlay bond coat, the bond coat consisting of 30 to 50 atomic percent aluminum, 0.5 to 15 atomic percent chromium and at least one element chosen from the group consisting of 0.01 to 0.5 atomic percent zirconium, 0.1 to 5 atomic percent titanium, 0.1 to 2 atomic percent silicon, 0.01 to 2.0 atomic percent hafnium, 0.02 to 0.2 atomic percent gallium, 0.01 to 1 atomic percent yttrium, and 0.02 to 0.5 atomic percent iron, the balance nickel and impurities.

13. A coating system as recited in claim 12, wherein the bond coat contains 0.01 to 0.5 atomic percent zirconium.

14. A coating system as recited in claim 12, wherein the bond coat consists of, in atomic percent, 30 to 50 aluminum, 0.01 to 2 hafnium, the balance nickel.

15. A coating system as recited in claim 12, wherein the bond coat consists of, in atomic percent, 30 to 50 aluminum, 0.5 to 15 chromium, and 0.01 to 2 hafnium, the balance nickel.

16. A coating system as recited in claim 12, wherein the bond coat consists of, in atomic percent, 30 to 50 aluminum, 0.5 to 15 chromium, and 0.01 to 0.5 zirconium, the balance nickel.

17. A coating system as recited in claim 12, wherein the bond coat consists of, in atomic percent, 30 to 50 aluminum, 0.5 to 15 chromium, 0.02 to 0.5 iron, 0.01 to 2 hafnium, and 0.01 to 1 yttrium, the balance nickel.

18. A coating system as recited in claim 12, wherein the bond coat consists of, in atomic percent, 30 to 50 aluminum, 0.5 to 15 chromium, 0.1 to 1 titanium, 0.02 to 0.2 gallium, and 0.01 to 2 hafnium, the balance nickel.

19. A coating system as recited in claim 12, wherein the bond coat consists of, in atomic percent, 30 to 50 aluminum, 0.02 to 0.2 gallium, and 0.01 to 2 hafnium, the balance nickel.

20. A coating system as recited in claim 12, wherein the bond coat consists of, in atomic percent, 30 to 50 aluminum, 0.1 to 5 titanium, 0.02 to 0.2 gallium, and 0.01 to 2 hafnium, the balance nickel.

21. A coating system as recited in claim 12, wherein the bond coat consists of, in atomic percent, 30 to 50 aluminum, 0.1 to 2 silicon, and 0.01 to 0.5 zirconium, the balance nickel.

22. A coating system as recited in claim 12, wherein the bond coat consists of, in atomic percent, 30 to 50 aluminum, 0.1 to 5 titanium, and 0.01 to 2 hafnium, the balance nickel.

23. A coating system as recited in claim 12, wherein the bond coat consists of, in atomic percent, about 1% titanium, about 0.5% hafnium, about 0.2% gallium, and about 48.3% aluminum, the balance nickel.

24. A coating system as recited in claim 12, wherein the bond coat consists of, in atomic percent, about 14.2% chromium, about 0.12% zirconium, and about 34.4% aluminum, the balance nickel.

25. A coating system as recited in claim 12, wherein the bond coat consists of, in atomic percent, about 1.75% chromium, about 0.25% zirconium, and about 42.9% aluminum, the balance nickel.

26. A coating system as recited in claim 12, wherein the bond coat consists of, in atomic percent, about 0.7% silicon, about 0.213% zirconium, and about 41.4% aluminum, the balance nickel.

27. A coating system as recited in claim 12, wherein the bond coat consists of, in atomic percent, about 1.04% titanium, about 0.14% hafnium, and about 45.5% aluminum, the balance nickel.

* * * * *